(12) United States Patent
Ni et al.

(10) Patent No.: US 8,409,675 B2
(45) Date of Patent: Apr. 2, 2013

(54) BREATHER

(75) Inventors: Guolong Ni, Shanghai (CN); Yingchun Fu, Shanghai (CN); Feng Xue, Shanghai (CN)

(73) Assignee: General Electric Company, Schenectady, NY (US)

( * ) Notice: Subject to any disclaimer, the term of this patent is extended or adjusted under 35 U.S.C. 154(b) by 225 days.

(21) Appl. No.: 12/843,383

(22) Filed: Jul. 26, 2010

(65) Prior Publication Data

US 2011/0027516 A1  Feb. 3, 2011

(30) Foreign Application Priority Data

Jul. 28, 2009  (CN) .................... 2009 2 0167358 U

(51) Int. Cl.
*B32B 1/04* (2006.01)
*F21V 31/03* (2006.01)

(52) U.S. Cl. ........................................ 428/34.1; 428/99

(58) Field of Classification Search ................. 428/34.1, 428/99; 362/294, 547
See application file for complete search history.

(56) References Cited

U.S. PATENT DOCUMENTS 4,405,974 A * 9/1983 Quiogue ..................... 362/362
2002/0090506 A1 * 7/2002 Protzner et al. ............... 428/334

* cited by examiner

*Primary Examiner* — Alexander Thomas
(74) *Attorney, Agent, or Firm* — GE Global Patent Operation; Peter T. DiMauro

(57) ABSTRACT

The present invention provides a breather that includes a waterproof air-permeable membrane and a mounting device, the mounting device having a rod with a hollow structure and a head at one side of the rod. The head includes a bottom wall which has a circular bore in communication with the hollow portion of the rod and around which sidewalls are formed, several through holes being formed in the sidewalls, a fastening cover cooperating with the head with a chamber formed therebetween, wherein the waterproof air-permeable membrane is mounted inside the rod, and wherein the through hoes, the chamber and the circular bore communicatively connect the inside and outside of the breather.

10 Claims, 3 Drawing Sheets

BREATHER

CROSS-REFERENCE TO RELATED APPLICATIONS

This application claims priority under 35 U.S.C. §119(a)-(d) or (f) to prior-filed, co-pending Chinese application number 200920167358.8, filed on Jul. 28, 2009, which is hereby incorporated by reference in its entirety.

BACKGROUND OF THE INVENTION

1. Field of Invention

The invention relates to a breather and in particular to a lamp breather with a waterproof air-permeable membrane.

2. Description of the Prior Art

Outdoor lamps as well as some types of indoor lamps are currently provided with seal rings between the lamp shell and glass or at other connection positions so as to guarantee the mechanical seal performance of the whole lamps. However in case of a great difference between the inner and outer temperatures of the lamp, a great difference between the pressures inside and outside the lamp housing irresistibly exists, which strictly challenges the mechanical seal system of the lamp and brings about a high risk of failure. By way of an example, the difference between the pressures inside and outside a working lamp will increase suddenly due to an abrupt rain and a drop in temperature, thus leading to easy entry of water or dust into the lamp. To address the above problem, a waterproof air-permeable membrane is typically arranged on the lamps so as to permit the passage of air while repelling water or like liquid. For example, expanded polytetrafluoroethylene (ePTFE) developed by General Electric Company in year 2008 can be used as a type of waterproof air-permeable membrane. Such waterproof air-permeable membrane facilitates to balance the pressures inside and outside the lamp housing, and thereby effectively protects the lamp against the sudden change of the outside temperature of the lamp.

Generally, such device equipped with a waterproof air-permeable membrane is referred to as a breather. A problem is that, the breather which is in partial communication with the outer environment can easily fail due to the environmental change. In the case where rain accumulates on the waterproof air-permeable membrane, the breather is prevented from keeping in communication with outside atmosphere and thus out of work.

SUMMARY OF THE INVENTION

To solve the above problems, the inventor of the present invention invents the following novel breather.

The present invention provides a breather, comprising a waterproof air-permeable membrane and a mounting device, the mounting device having a rod with a hollow structure and a head at one side of the rod, the head comprising a bottom wall which has a circular bore in communication with the hollow portion of the rod and around which sidewalls are formed, several through holes being formed in the sidewalls, a fastening cover cooperating with the head with a chamber formed therebetween, wherein the waterproof air-permeable membrane is mounted inside the rod, and the through holes, the chamber and the circular bore communicatively connect the inside and outside of the breather.

Thanks to the cooperating structure of the fastening cover and the head, rain is prevented from accumulating on the waterproof air-permeable membrane of the breather according to the embodiment of the present invention, so as to guarantee the waterproof air-permeable membrane in communication with the outside and more effectively protect the lamps against the sudden change of the outside temperature the lamps.

BRIEF DESCRIPTION OF THE DRAWINGS

The details and advantages of the present invention will become more apparent from the following drawings of an exemplary embodiment according to present invention.

DETAILED DESCRIPTION

Figure 1:
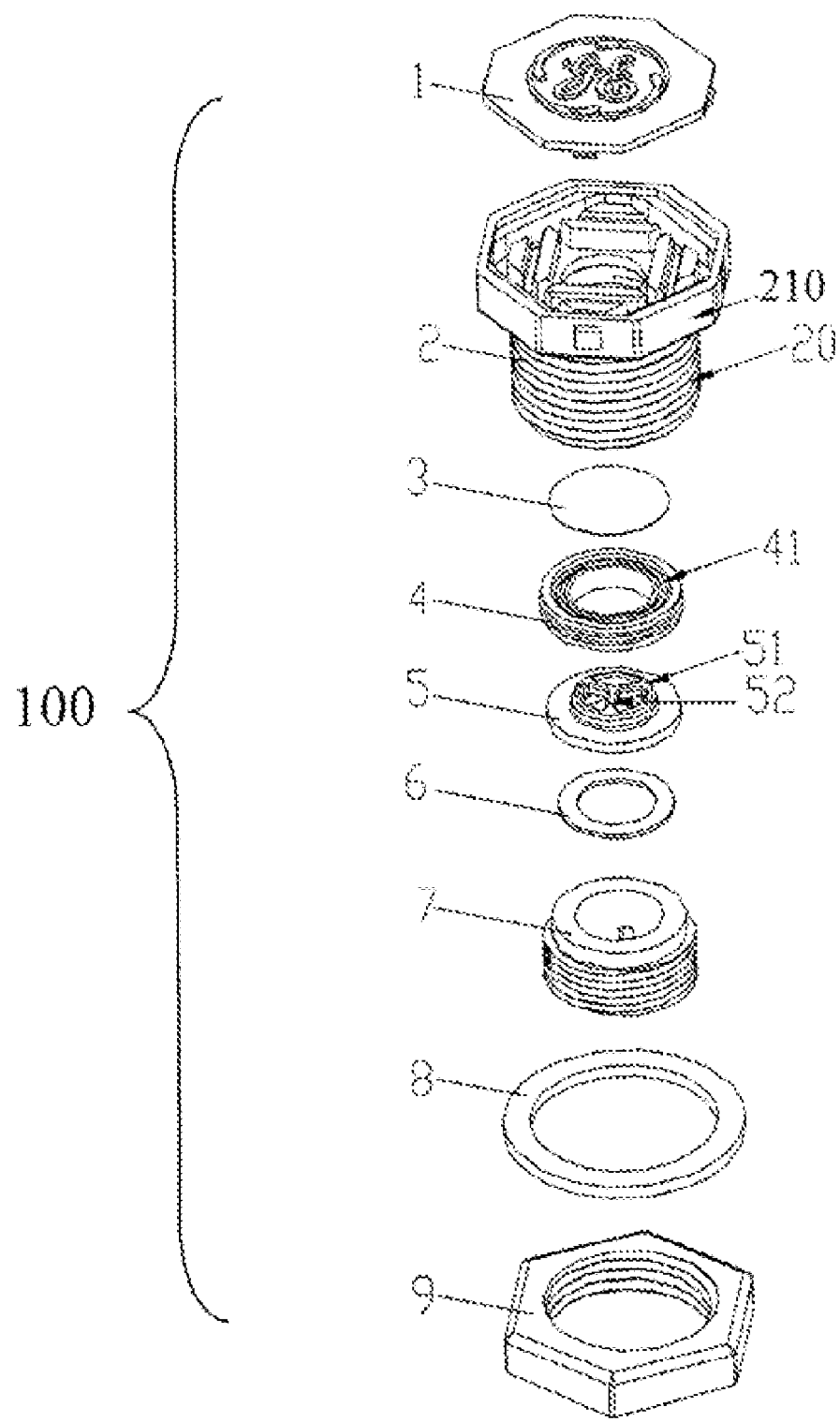
FIG. 1 is an exploded view of a breather according to an embodiment of the present invention.

FIG. 1 is a schematic view illustrating the structure of the breather 100 according to an embodiment of the present invention suitable for a lamp or other device. The breather comprises a waterproof air-permeable membrane 3 and a mounting device for mounting the waterproof air-permeable membrane 3.

The breather 100 comprises an octagonal eye-bolt 2. The bolt 2 comprises a hollow screw rod 20 provided with threads on both the inner and outer walls, as well as an octagonal head 210 with a circular bore 27 in the centre (see FIG. 2) for communication with the hollow portion of the screw rod. A nut 9 and a waterproof gasket 8 cooperate with the bolt 2 so as to secure the breather 100 onto a lamp or other device. The waterproof air-permeable membrane 3, the waterproof gasket 4, the support 5, the gasket 6 and the internal screw rod 7 are to be mounted inside the hollow screw rod 20.

The bolt 2 secures the waterproof gasket 4 inside the breather 100 by engaging with the internal screw rod 7. The waterproof gasket 4 is provided with annular injection channels 41 on the upper surface for injecting liquid glue; while the waterproof air-permeable membrane 3 is fixed onto the waterproof gasket 4, thereby the waterproof air-permeable membrane 3 and the waterproof gasket 4 are secured to each other with the liquid glue. The waterproof air-permeable membrane 3 and the waterproof gasket 4 are arranged in the inner hollow space inside the hollow screw rod 20 with the support 5 beneath the waterproof gasket 4. The support 5 carries an annular projection 51 whose diameter is slightly smaller than the inner diameter of the waterproof gasket 4. The annular projection 51 supports the waterproof gasket 4 in order to prevent the deformation caused by inward retraction of the waterproof gasket 4. Triangular ribs 52 are provided inside the annular projection 51 in such a way that they project into the waterproof gasket 4. Such ribs 52 avoid the inward deformation of the waterproof air-permeable membrane 3 in the presence of the difference between the inner and outer pressures of the breather 100. The inner screw rod 7 is mounted inside the bolt 2 so that they are secured to each other by means of the threads. The gasket 6 cooperates with the inner screw rod 7 to protect the support 5 against wear due to excessive force applied by the inner screw rod 7.

Figure 2:
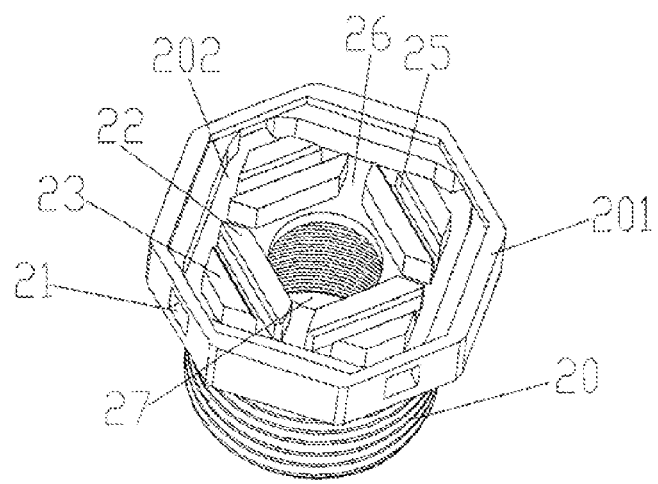
FIG. 2 is a schematic view of the octagonal bolt of the breather according to the present invention.

The bolt 2 has an octagonal head 210 cooperating with a fastening cover 1 in order to create an air path for the communication between the waterproof air-permeable membrane 3 and the environment. As shown in FIG. 2, the octagonal head 210 has a horizontal bottom wall 202 around whose border sidewalls 201 are formed. Through holes 21 are formed in some of the sidewalls. The lower borders of the through holes are arranged in the same plane with the horizontal bottom wall 202 or lower than the horizontal bottom wall 202. Ribs 22 and 23 are arranged inside the sidewalls and correspond to the through holes in such a way that such ribs 22 and 23 lie immediately opposite to the through holes 21 and between the through holes 21 and the circular bore 27 of the bottom wall. A channel 25 is created between each pair of ribs 22 and 23. A channel 26 is created between any two adjacent ribs 22. The circular bore 27 is surrounded by the ribs 22 but in communication with the environment via the channels 26 and the through holes 21.

Figure 3:
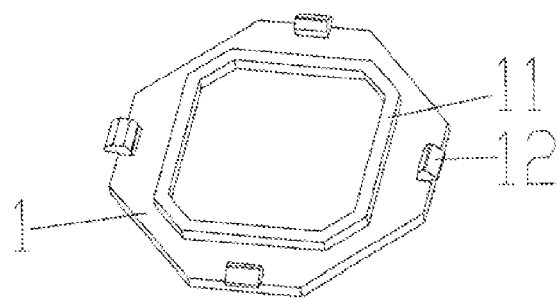
FIG. 3 is a schematic view of the upper cover of the breather according to the present invention.
Figure 4:
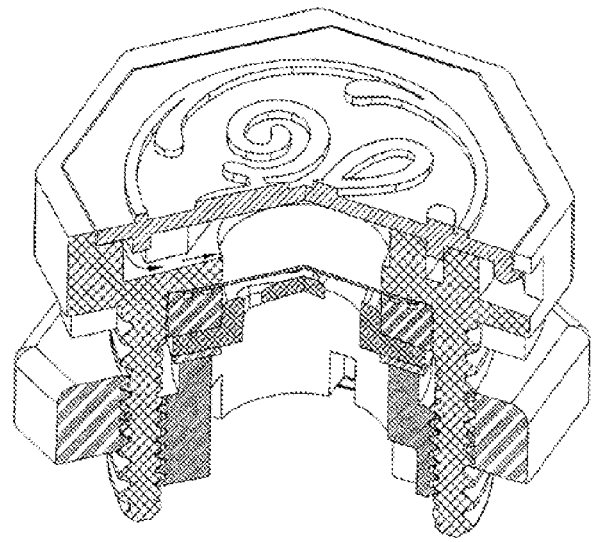
FIG. 4 is a partial cutaway view of the breather according to the present invention.
Figure 5:
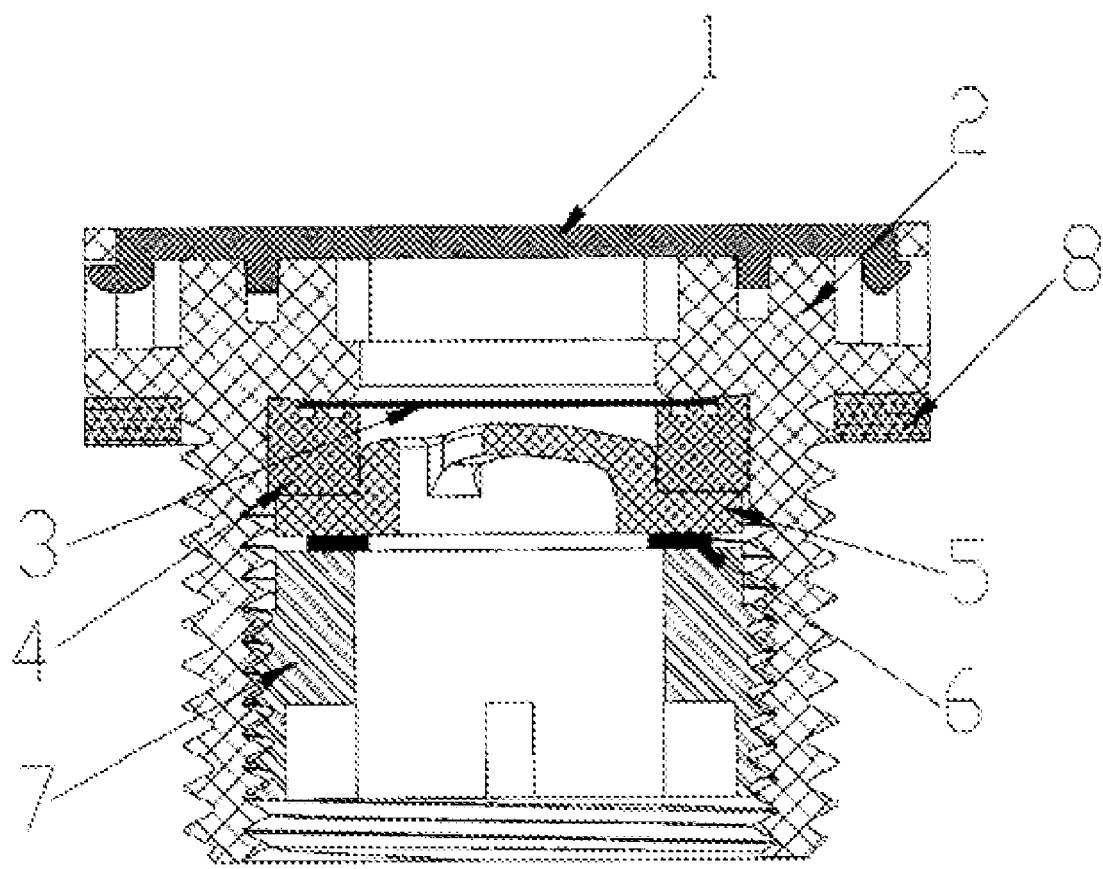
FIG. 5 is cutaway view of the upper cover of the breather according to the invention after mounting onto the octagonal bolt.

As shown in FIG. 3, the fastening cover 1 is similar with the octagonal head 210 in shape so as to be fitted to each other. The cover has several fasteners 12 along the border so as to cooperate with the sidewalls of the octagonal head 210. A rib wall 11 is arranged at predetermined position inward of the fasteners 12, in a form of a close loop so as to cooperate with the channels 25 on the octagonal head 210. When the fastening cover 1 is mounted on the octagonal head 210, the rib wall 11 is disposed in the channels 25 between the ribs 22 and 23, while a certain distance is interposed between the rib wall 11 and the bottom wall 202 of the octagonal head 210 (see FIGS. 4 and 5) thereby an air-retaining circulation space is formed between the rib wall 11 and the bottom wall 202.

Thus after the fastening cover 1 is mounted onto the octagonal head 210, the waterproof air-permeable membrane 3 communicates with the environment via the circular bore 27, the channels 26 and the through holes 21, effectively preventing the breather 100 from damage due to the difference between the inner and outer pressures. In the presence of sudden water flow, because of the cooperating structure of the fastening cover 1 and the octagonal head 210, such water flow will not directly act onto the waterproof air-permeable membrane 3 which leads to accumulating. When a small quantity of water flows into the head 210 via the through holes 210, the water is blocked from moving on by the ribs 23 but inertially flows along the baffles formed by the ribs 23 and the rib wall 11, and finally flows out from an adjacent through hole 21. If a small quantity of water flows inside the head 210 via a channel 26, such small quantity of water will flow out along the bottom wall 202 via another channel 26 nearby because the bottom wall is arranged horizontally. It has been experimentally demonstrated that, thanks to the embodiment of the present invention, almost no water will flow toward the waterproof air-permeable membrane 3 through the circular bore 27 and thus attach onto the membrane 3.

As shown, due to the particular labyrinth type structure of the fastening cover 1 and the octagonal head 210, the waterproof air-permeable membrane 3 can on the one hand be in good communication with the environment, and on the other hand be protected against the water flow.

In the above description, when the position of one element relative to the other illustrated in the drawings is introduced, terms regarding spatial positions of "on", "above", "under", "below" and so on are used. It shall be understood that such terms on spatial positions are intended to cover different orientations in addition to those disclosed in the drawings. For example, when the illustrated device is reversed, the element described as "below" the other element becomes "above" the other element or feature.

The foregoing description of the invention has been presented by means of preferred embodiment. However those skilled in the art may make various variations and alternations without departing from the spirit and the scope of the present invention. Therefore, the protection scope of the present invention is delimited by the appended claims and the equivalent features.

What is claimed is:

1. A breather, comprising:
    a waterproof air-permeable membrane; and
    a mounting device having a rod with a hollow structure and a head at one side of the rod, wherein the head comprises:
        a bottom wall which has a circular bore in communication with the hollow structure of the rod and around which sidewalk are formed;
        several through holes being formed in the sidewalk; and
        a fastening cover cooperating with the head with a chamber formed there between,
    wherein the waterproof air-permeable membrane is mounted inside the rod, and
    wherein the through holes, the chamber and the circular bore communicatively connect the inside and outside of the breather.

2. The breather according to claim 1, wherein the lower borders of the through holes in sidewalk of the head of said mounting device are not higher than the plane where the bottom wall of the chamber locates.

3. The breather according to claim 1, further comprising ribs projecting into the chamber formed in at least one of the bottom wall of the head of said mounting device and the fastening cover.

4. The breather according to claim 3, wherein the ribs formed in the bottom wall of said head are positioned between the through holes in the sidewalls and the circular bore of the bottom wall, and adjacent ribs are spaced apart so as to create channels passing the through holes and the circular bore.

5. The breather according to claim 4, further comprising a pair of ribs formed at predetermined positions inside the chamber and corresponds to each through hole, thereby forming a channel between each pair of the ribs.

6. The breather according to claim 5, further comprising a rib wall formed on the fastening cover and disposed in the channels between the ribs.

7. The breather according to claim 6, wherein said mounting device is in an eye-bolt structure and an internal screw rod is disposed inside the bolt by means of thread engagement so that the waterproof air-permeable membrane is fixed between the bolt and the internal screw rod.

8. The breather according to claim 7, wherein said waterproof air-permeable membrane is further fixed onto a waterproof gasket which is provided with injection channels on the upper surface for injecting liquid glue so as to secure the waterproof air-permeable membrane on the gasket.

9. The breather according to claim 8, further comprising a support arranged between said eye-bolt structure and the internal screw rod and positioned under the waterproof gasket, said support comprises an annular projection whose diameter is slightly smaller than the inner diameter of the waterproof gasket, and ribs projecting into the waterproof gasket are provided inside the annular projection.

10. The breather according to claim 1, wherein said breather is a lamp breather which further comprises a nut, and the nut cooperates with the eye-bolt structure so as to secure the breather onto a lamp.

* * * * *

UNITED STATES PATENT AND TRADEMARK OFFICE
CERTIFICATE OF CORRECTION

PATENT NO. : 8,409,675 B2  
APPLICATION NO. : 12/843383  
DATED : April 2, 2013  
INVENTOR(S) : Ni et al.

Page 1 of 1

It is certified that error appears in the above-identified patent and that said Letters Patent is hereby corrected as shown below:

In the Claims:

In Column 4, Line 16, in Claim 1, delete "sidewalk" and insert -- sidewalls --, therefor.

In Column 4, Line 17, in Claim 1, delete "sidewalk;" and insert -- sidewalls; --, therefor.

In Column 4, Line 26, in Claim 2, delete "sidewalk" and insert -- sidewalls --, therefor.

Signed and Sealed this  
Eighteenth Day of June, 2013

Teresa Stanek Rea  
*Acting Director of the United States Patent and Trademark Office*